United States Patent [19]
Overhage et al.

[11] Patent Number: 5,446,650
[45] Date of Patent: Aug. 29, 1995

[54] LOGIC SIGNAL EXTRACTION

[75] Inventors: Craig Overhage, Beaverton; Richard Austin, Hillsboro, both of Oreg.

[73] Assignee: Tektronix, Inc., Wilsonville, Oreg.

[21] Appl. No.: 135,099

[22] Filed: Oct. 12, 1993

[51] Int. Cl.$^6$ ............................................. G01R 13/00
[52] U.S. Cl. ................................ 364/487; 324/121 R; 364/577
[58] Field of Search ................... 324/121 R; 364/487, 364/577

[56] References Cited

U.S. PATENT DOCUMENTS

| | | | |
|---|---|---|---|
| 4,039,784 | 8/1977 | Quarton et al. | 324/103 R X |
| 4,251,814 | 2/1981 | Dagostino | 345/134 |
| 4,271,488 | 6/1981 | Saxe | 365/45 X |
| 4,353,032 | 10/1982 | Taylor | 328/165 |
| 4,425,643 | 1/1984 | Chapman et al. | 371/20 |
| 4,481,647 | 11/1984 | Gombert et al. | 375/107 |
| 4,495,586 | 1/1985 | Andrews | 364/487 |
| 4,558,422 | 12/1985 | DenBeste et al. | 364/480 |
| 4,578,666 | 3/1986 | Anderson | 340/146.2 |
| 4,585,975 | 4/1986 | Wimmer | 315/392 |
| 4,646,297 | 2/1987 | Palmquist et al. | 371/1 |
| 4,647,862 | 3/1987 | Blair | 364/487 X |
| 4,647,922 | 3/1987 | Saxe | 324/121 R X |
| 4,704,691 | 11/1987 | Blair | 324/121 R X |
| 4,713,771 | 12/1987 | Crop | 364/487 |
| 4,731,768 | 3/1988 | Easterday | 368/118 |
| 4,763,117 | 8/1988 | Blattner et al. | 364/481 X |
| 4,774,498 | 9/1988 | Traa | 341/159 |
| 4,777,616 | 10/1988 | Moore et al. | 371/15 X |
| 4,779,028 | 10/1988 | Blair | 315/367 |
| 4,809,189 | 2/1989 | Batson | 364/487 |
| 4,812,769 | 3/1989 | Agoston | 328/63 |
| 4,908,621 | 3/1990 | Polonio et al. | 341/120 |
| 4,949,361 | 8/1990 | Jackson | 375/118 |
| 4,968,902 | 11/1990 | Jackson | 307/360 |
| 4,979,177 | 12/1990 | Jackson | 377/20 |
| 4,985,702 | 1/1991 | Penney | 341/118 |

(List continued on next page.)

OTHER PUBLICATIONS

"Logic Analyzer Goes Analog", Stan Runyon, EE Times, Dec. 9, 1991.

"Logic/Oscilloscope Speeds Debugging Time", John Novellino Electronic Design, Apr. 26, 1990, pp. 57-60.

"Combined Instruments Find Logic Problems", Dough Conner, EDN, Aug. 5, 1991, pp. 77, 79, 80, 82, 84.

"Timing Logica Analyzer Boasts 1-NS Resolution", John Novellino, Electronic Design, Jul. 25, 1991, p. 171.

"Advanced ADCs in Digital Oscilloscopes Will En-
(List continued on next page.)

Primary Examiner—Edward R. Cosimano
Attorney, Agent, or Firm—Boulden G. Griffith

[57] ABSTRACT

Methods for producing logic signal displays for an instrument known as a "logic oscilloscope" are disclosed. A digital input signal is first sampled as an analog signal to produce multi-bit digital samples that are representative of the amplitude of the input signal over time. The multi-bit digital samples are then processed using interpolative techniques to ascertain when the input signal crossed a hypothetical logic level threshold or pair of thresholds and when the signal was in one logic state or the other. The resulting transition times and logic states are then used as the basis for generating a variety of digital displays, including logic timing diagrams, state table displays, and cursor readouts similar to those available in a logic analyzer. Setup and hold time violations and measurements may also be obtained using this information. In a pseudo-synchronous mode of operation, one logic signal is treated as a virtual clock signal, so that the states of other (data) signals are determined at times controlled by the active transitions of this clock signal. A cursor provides a digital readout of the logic value of one or more signals, whether they are displayed in analog form or logic timing diagram form or not shown on the screen at all.

21 Claims, 5 Drawing Sheets

U.S. PATENT DOCUMENTS

| | | | |
|---|---|---|---|
| 5,043,927 | 8/1991 | Jackson | 364/551.01 |
| 5,097,147 | 3/1992 | Stuebing et al. | 307/354 |
| 5,144,525 | 9/1992 | Saxe et al. | 365/45 |
| 5,162,723 | 11/1992 | Marzalek et al. | 364/485 X |

OTHER PUBLICATIONS hance Design Awareness", Tom Saponas, Electronic Design, Jan. 11, 1990, p. 169.

"A 4 GHz 8b Data Acquistion System,", Ken Rush/Pat Byrne, 1991 IEEE International Solid-State Circuits Conference, Feb. 14, 1991, pp. 176, 177, 312.

"Specifications and Characteristics", HP 16532A Logic Analyzer, Hewlett-Packard Manual, Feb., 1991.

"Logic Analyzers Assume New Roles in Debugging 32-Bit CISC Systems", Dan Strassberg, EDN, Dec. 20, 1990, pp. 134–140.

"Combined Scope/Logic Analyzers Detect Hard-to-Find Analog Problems", Mike Donlin, Computer Design, Feb. 1, 1991, p. 54.

(9)

LOGIC SIGNAL EXTRACTION

FIELD OF THE INVENTION

This invention relates to the display of digital signals by oscilloscopes, and more particularly to a new method of deriving logic signals for display by these instruments.

BACKGROUND OF THE INVENTION

Digital storage oscilloscopes are a type of oscilloscope in which an input analog signal is sampled rapidly at periodic intervals and converted to a series of digital values representing the amplitude of the input signal as it varies over time. U.S. Pat. No. 4,779,028 to Blair for "Digital Storage Oscilloscope with Marker for Trigger Location", hereby incorporated by reference, describes the basic operation of digital storage oscilloscopes.

As in analog oscilloscopes, a "trigger" signal determines when a data acquisition is to begin. The trigger signal is used to activate a timebase generator which then produces a very stable and reproducible set of strobe signals. Simple triggers are generated whenever a selected signal crosses a particular voltage threshold. More complex forms of trigger generation have been developed. See for example, U.S. Pat. No. 4,585,975 to Wimmer for "High Speed Boolean Logic Trigger Oscilloscope Vertical Amplifier with Edge Sensitivity and Nested Trigger" or U.S. Pat. No. 5,097,147 to Stuebing for "Limited Amplitude Signal Trigger Circuit", both hereby incorporated by reference. U.S. Pat. No. 4,812,769 to Agoston for "Programmable Sampling Time Base Circuit", hereby incorporated by reference, describes a timebase circuit for a waveform sampling system that produces a strobe signal after an adjustable strobe delay interval.

An oscilloscope front end designed for the rapid acquisition of digital samples representative of the behavior analog signals is described in U.S. Pat. No. 5,144,525 to Saxe et al. for "Analog Acquisition System Including a High Speed Timing Generator", hereby incorporated by reference. Another high speed, fast-in slow-out (FISO) acquisition system is described in U.S. Pat. No. 4,271,488 to Saxe for a "High-Speed Acquisition System Employing an Analog Memory Matrix", hereby incorporated by reference.

The captured analog samples must be converted to multi-bit digital representations of the actual instantaneous voltage value that was present at the time that the sample was taken. U.S. Pat. Nos. 4,774,498 to Traa for "Analog-to-Digital Converter with Error Checking and Correction Circuits", 4,908,621 to Polonio et al for "Autocalibrated Multistage A/D Converter", and 4,985,702 to Penney for "Analog to Digital Converter with Second Order Error Correction", each hereby incorporated by reference, all describe prior art techniques pertaining to analog-to-digital conversion.

The digital values obtained by sampling the analog input signal and performing analog-to-digital conversion are normally stored in an acquisition memory at sequential addresses. Each address location then contains a digital value representing the amplitude of the input signal at a time that is proportional to its relative address number. In the case of repetitive waveforms, the same result can be achieved even if all of the data is not acquired at once. U.S. Pat. No. 4,495,586 to Andrews for "Waveform Acquisition Apparatus and Method", hereby incorporated by reference, describes how waveform data may be built up over time by partially sampling the waveform on successive occurrences. This method has come to be known as "equivalent time" sampling and is further discussed in U.S. Pat. No. 4,809,189 to Batson for "Equivalent Time Waveform Data Display", hereby incorporated by reference.

The digital values representing the behavior of the analog signal can then be presented on an oscilloscope display in several ways. In each of these approaches, the times between samples are converted to distance along the horizontal axis of the display according to the timebase selected by the operator, e.g., one millisecond per division. The sampling rate itself may also be increased or decreased according to the selected timebase so that the record length of the storage memory more closely corresponds to a full screen of displayed data. The stored digital value for each horizontal location is then converted to a vertical distance on the screen and a dot is display at the resulting coordinate. The absolute relationship between the digital values and vertical screen location also depends on operator selected settings of vertical gain and offset controls.

When the number of sample points is sparse, a line can be drawn between successive dots to give the impression of a continuous analog signal, such as would have been displayed by an analog oscilloscope. U.S. Pat. No. 4,251,814 to Dagostino for "Time Dot Display for a Digital Oscilloscope", hereby incorporated by reference, describes a display in which acquired data is shown intensified relative to interpolated data. Interpolated data can also be used to perform automatic waveform measurements, such as pulse width measurements, when the underlying data is sparse.

When a large number of sample points are available, various decimation techniques can be employed to simplify the data and make it more meaningful. One such technique is to identify the minimum and maximum amplitude values within a particular time interval (longer than the sampling interval), and then display a vertical bar extending from the minimum to the maximum amplitudes over the portion of the display corresponding to the particular time interval. U.S. Pat. No. 4,039,784 to Quarton et al. for "Digital Minimum/Maximum Vector CRT Display", and U.S. Pat. No. 4,713,771 to Crop for "Digital Minimum-Maximum Value Sequence Processor", both hereby incorporated by reference, provide background on min/max displays.

Logic analyzers are digital data acquisition instruments that allow a user to acquire and analyze digital data from a large number of logic signals, such as all of the address, data, and control signals associated with a microprocessor. The behavior of groups of these signals can then be monitored to analyze the behavior of the system under test. Each logic signal is compared to a logic threshold and resolved into one of two logic states, or when dual thresholds are used into one of three states, the two basic logic states and an intermediate "unstable" state. The two logic states are variously referred to as high or low, one or zero, true or false, while signals that are determined to be between logic states by dual threshold analysis are said to be "unstable" or "in transition". U.S. Pat. No. 4,968,902 to Jackson for "Unstable Data Recognition Circuit for Dual Threshold Synchronous Data", hereby incorporated by reference, describes circuitry for detecting when one or more signals under analysis are between logic thresholds. U.S. Pat. No. 5,043,927, also to Jackson, for "Digital Signal Quality Analysis Using Simultaneous Dual-Threshold Data Acquisition", also hereby incorporated by reference, describes a method for finding a variety of signal anomalies in a repetitive signal using movable dual thresholds in a succession of measurements on a repetitive waveform.

In logic analyzer data acquisition using a single threshold, the input signal is applied to a voltage comparator whose other input is the voltage threshold that defines the boundary between the two logic states. The output of this comparator is a binary signal that rapidly transitions between high and low levels whenever the analog input signal crosses the logic threshold. Upon the occurrence of active edges of an acquisition clock signal, one or the other of these logic levels is stored in a flip-flop or similar circuit for further processing.

The time at which the state of the logic signals under analysis is resolved into binary form is determined by a clock signal. If this clock signal is generated by the logic analyzer and is independent of the system under test, the acquisition is said to be "asynchronous". If the clock signal is derived from the system under test so as to bear a predetermined timing relationship to at least part of the activity within that system, the acquisition is said to be "synchronous".

Data that is originally synchronous to the user's system clock must be resynchronized to the internal clock of the logic analyzer for further processing. U.S. Pat. No. 4,949,361 to Jackson for "Digital Data Transfer Synchronization Circuit and Method", hereby incorporated by reference, describes circuitry for accomplishing this task efficiently.

Typically, asynchronous data acquisition is relatively rapid and is used for analyzing the "timing" of circuit hardware. And, synchronous data acquisition is typically relatively slower and is used for analyzing the "state" of the system during software execution. U.S. Pat. No. 4,425,643 to Chapman et al. for a "Multi-Speed Logic Analyzer", hereby incorporated by reference, describes a logic analyzer with two sections capable of operating in conjunction with two different clocks. This type of architecture permits coordinated state and timing analysis. U.S. Pat. No. 4,763,117 to Blattner et al. for "Measurement Instruments with Multiple Operation Levels", hereby incorporated by reference, shows a logic analyzer having different modes for basic operation, advanced timing analysis, advanced state analysis, and full operation.

Once data is acquired from two different clock signals (also referred to as "timebases") that are asynchronous to each other and therefore "unrelated", methods must be found to make their relative timing relationships available to the operator of the logic analyzer. U.S. Pat. No. 4,558,422 to DenBeste et al. for a "Digital Signal Sampling System with Two Unrelated Sampling Timebases", and U.S. Pat. No. 4,578,666 to Anderson for a "Method of Comparing Data with Asynchronous Timebases", both hereby incorporated by reference, both describe ways of handling data so that an accurate display of timing relationships is presented to the operator.

Another approach to keeping track of the sampling time associated with different events is the use of "timestamps". Timestamps are a count that is stored when each sample is acquired, and which can then later be used for a variety of purposes. U.S. Pat. No. 4,731,768 to Easterday for "Autoranging Time Stamp Circuit", hereby incorporated by reference, describes one approach to timestamp generation.

The data in the system under analysis may suffer from a variety of defects that distinguish it from theoretically ideal digital data, i.e., data that goes from one stable and well defined logic state to another in an appropriate transition. Data may contain "glitches" or be unstable in some other way, or the data transition may suffer from slow rise or fall times, or exhibit other less-than-ideal behaviors. U.S. Pat. No. 4,353,032 to Taylor for "Glitch Detector", hereby incorporated by reference, describes glitches and a circuit for capturing information about them.

Since logic analyzers acquire signals across a large number of channels simultaneously, and the signal paths through the input circuitry of the logic analyzer or the probes used to connect to the user's system may not be all exactly equivalent electrically, the propagation times of signals passing through these different paths may not be all the same. When this occurs, one signal is said to exhibit "skew" in relation to a another signal. U.S. Pat. No. 4,646,297 to Palmquist et al. for "Skew Detector", hereby incorporated by reference, describes a circuit for detecting this condition. U.S. Pat. No. 4,481,647 to Gombert et al. for "Method and Apparatus of Compensating for Variations in Signal Propagation Time Existing Within the Channels of a Multi-Channel Device", hereby incorporated by reference, describes means for correcting skew errors.

The "resolution" of a logic analyzer is typically $\pm\frac{1}{2}$ of the acquisition clock period, e.g., 10 ns for a 100 MHz clock. U.S. Pat. No. 4,979,177 to Jackson for "Enhanced Counter/Timer Resolution in a Logic Analyzer", hereby incorporated by reference, describes a logic analyzer with the ability to use two phases of the system clock to acquire data and then maintain the resulting improved resolution as the data is manipulated internally using a single phase clock. The result is an effectively doubled resolution, e.g., 5 ns for a 100 MHz clock. Another approach is described in U.S. Pat. No. 4,777,616 to Moore et al. for "Increased Resolution Logic Analyzer Using Asynchronous Sampling", hereby incorporated by reference. This approach relies on repeatedly sampling a repetitive signal asynchronously to increase the effective resolution.

All synchronous digital circuitry requires a certain degree of stability of its inputs in order to guarantee appropriate and reliable behavior of its outputs. The time that inputs must be stable before a synchronizing event in order to assure proper operation is known as "setup time", while the time that inputs must be stable after the synchronizing event to assure proper operation is known as "hold time". A logic analyzer also has setup and hold times of its own. Normally, the setup time of a logic analyzer is as short as possible and its hold time is zero.

A conventional logic analyzer typically does some processing of a user's clock signal before using it to acquire synchronous data. Since this processing takes some time, the data signals that are to be clocked also must be delayed in order to position the setup and hold time window appropriately. The inclusion of delay lines on every channel adds a significant amount to the price of a logic analyzer. Moreover, equalizing the resulting delays can add additional expense and complexity. If every delay line is adjustable, channel-to-channel skew can be minimized and the setup and hold window can be moved. Even though putting adjustable delay lines on every channel is quite expensive, it has frequently been done in order to make logic analyzers with suitable specifications. Since the setup and hold time for the whole logic analyzer is only as good as its worst channel, channel-to-channel skew degrades the instrument's overall setup and hold time performance as well as having a variety of other detrimental effects.

Several efforts have been made to combine some of the features of logic analyzers with those of oscilloscopes. The Hewlett-Packard 16500 series and the Tektronix Prism 3000 logic analyzers each offer plug-in modules with digital storage oscilloscope capabilities and displays that allow time correlated viewing of the digital and analog signals acquired at the same time. These instruments permits their users to alternatively look at signals with a logic analyzer perspective or a digital storage oscilloscope perspective. The latter perspective is helpful for looking at the details of a logic signal, its shape, rise and fall times, ringing, undershoot and overshoot, etc. The model 1600 Logic Oscilloscope made by Outlook Technology allows the user to switch between a 200 MHz logic analyzer mode and a 350 MHz, 100 Msample/sec digital storage oscilloscope mode. Biomation Corporation offers an instrument identified as the K1600 Analog Logic Analyzer which is a digital storage oscilloscope with logic timing-analyzer triggering.

None of the oscilloscope and logic analyzer module combinations use the same set of acquired analog data samples for both oscilloscope type displays and logic analyzer type displays. In each of these instruments, when the user selects a logic display, data for that display is acquired in traditional logic analyzer fashion, i.e., storing samples from the output of a comparator which has already resolved the signal into a digital logic level before it is sampled.

SUMMARY OF THE INVENTION

In accordance with the present invention there is provided a new method for producing logic signal displays for a "logic oscilloscope". The digital input signal is first sampled as an analog signal to produce multi-bit digital samples that are representative of the amplitude of the input signal over time. The multi-bit digital samples are then processed using interpolative techniques to ascertain with relative exactitude when the input signal crossed a hypothetical logic level threshold or pair of thresholds and when the signal was in one logic state or the other. The resulting transition times and logic states are then used as the basis for generating a variety of digital displays, including logic timing diagrams, state table displays, and cursor readouts similar to those available in a logic analyzer, but with enhanced resolution that is derived from the extra information contained in the original multi-bit analog sampling. In a pseudo-synchronous mode of operation, one logic signal is treated as a virtual clock signal, so that the states of other (data) signals are determined at times controlled by the active transitions of this clock signal. A cursor provides a digital readout of the logic value of one or more signals, whether they are displayed in analog form or logic timing diagram form or not shown on the screen at all.

DETAILED DESCRIPTION OF THE INVENTION

Figure 1:
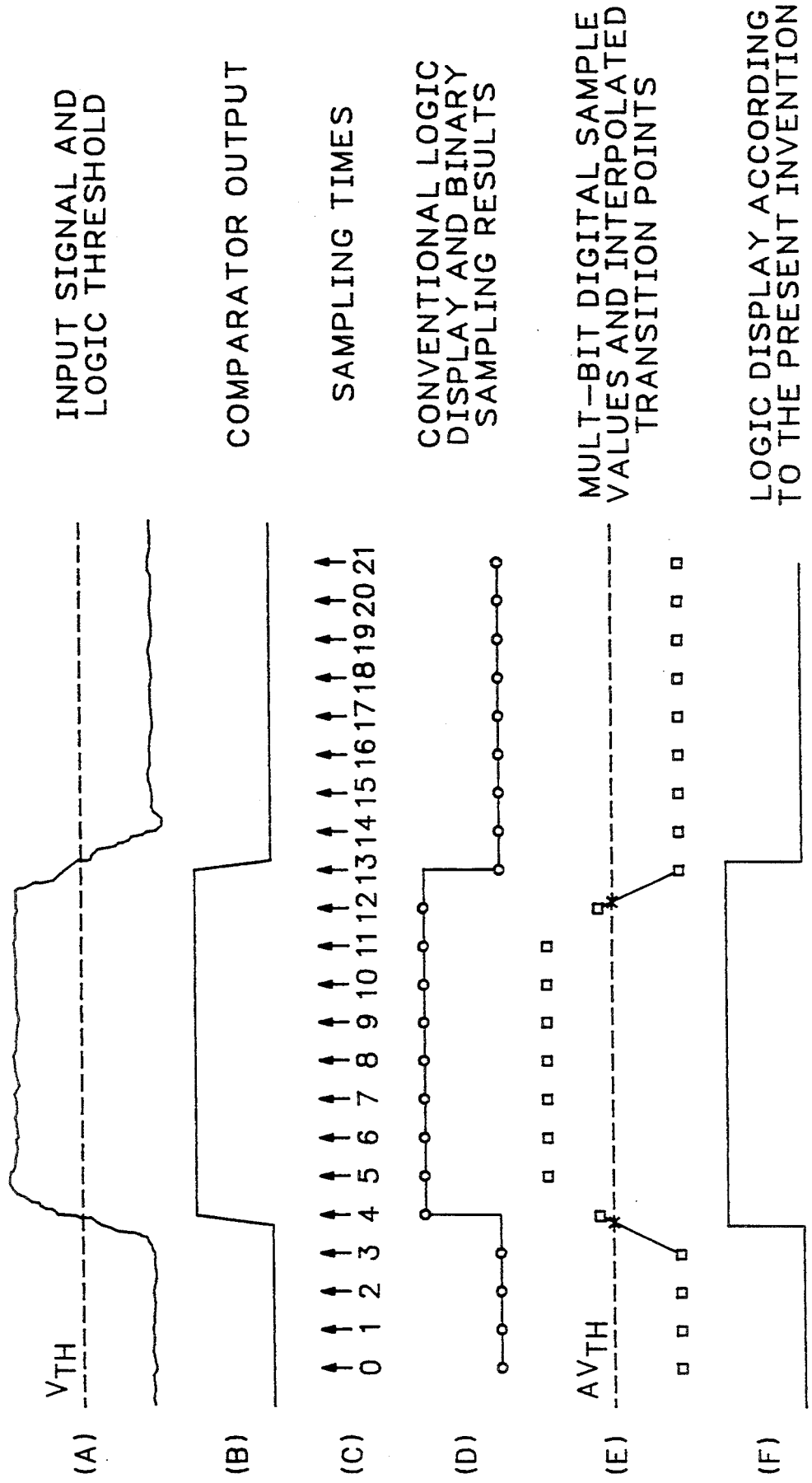
FIG. 1 is a set of diagrams illustrating the method of generating a logic timing diagram according to the present invention and how it differs from the conventional approach.

FIG. 1 shows a set of diagrams, (A) through (F), illustrating the method of generating a logic timing diagram according to the present invention and how the results of that method differ from the conventional approach taken by logic analyzers.

The input signal is shown in the (A) portion of FIG. 1, along with the single voltage threshold $V_{TH}$ used to distinguish logic ones from logic zeros. When this signal is applied to a comparator, as in logic analyzers, the output is a binary signal. Such a binary signal is shown in FIG. 1, part (B), the comparator output. The next part of FIG. 1, part (C), shows a series of up-pointing arrows indicating the times that sampling occurs, either conventional binary sampling or multi-bit digital sampling to define an analog value, as required for the practice of the present invention. These arrows represent the active edges of acquisition clock signals or the active edges of a series of acquisition strobe signals.

In a logic analyzer the comparator output signal shown in part (B) of FIG. 1 is sampled at the sampling times shown in part (C) to produce a series of sampling results, as shown in part (D), that are either high or low, one or zero. In part (D), little circles and little black dots superimposed over the conventional logic display indicate these binary sampling results, with the circles indicating zeros (lows) and the dots indicating ones (highs).

The conventional logic display shown superimposed with the circles and dots in part (D) relies on making an arbitrary assumption about the state of the comparator output between sampling times. For example, in FIG. 1, the binary sample taken at time 3 was low and the one taken at time 4 was high, but the software producing the conventional display has no way of knowing when the actual transition occurred. Similarly, the binary sample taken at time 13 was high and the one taken at time 14 was low, but again there is no way of knowing when the actual transition occurred. Typically, an arbitrary assumption is made and the transition is shown as if it occurred exactly at the end of the period between the two sample times. Thus, the conventional logic display shown in part (D) of FIG. 1 shows the signal going high exactly at time 4 and returning to low exactly at time 14. However, close scrutiny of part (A) of FIG. 1 in conjunction with the sampling times shown in part (C) shows that the input signal actually crossed the threshold slightly before time 4 and very slightly after time 13. Thus, the conventional logic timing diagram display can be misleading with regard to the time placement of signal edges (logic state transitions) by amounts of up to one complete sampling clock (or strobe) interval.

Figure 4A:
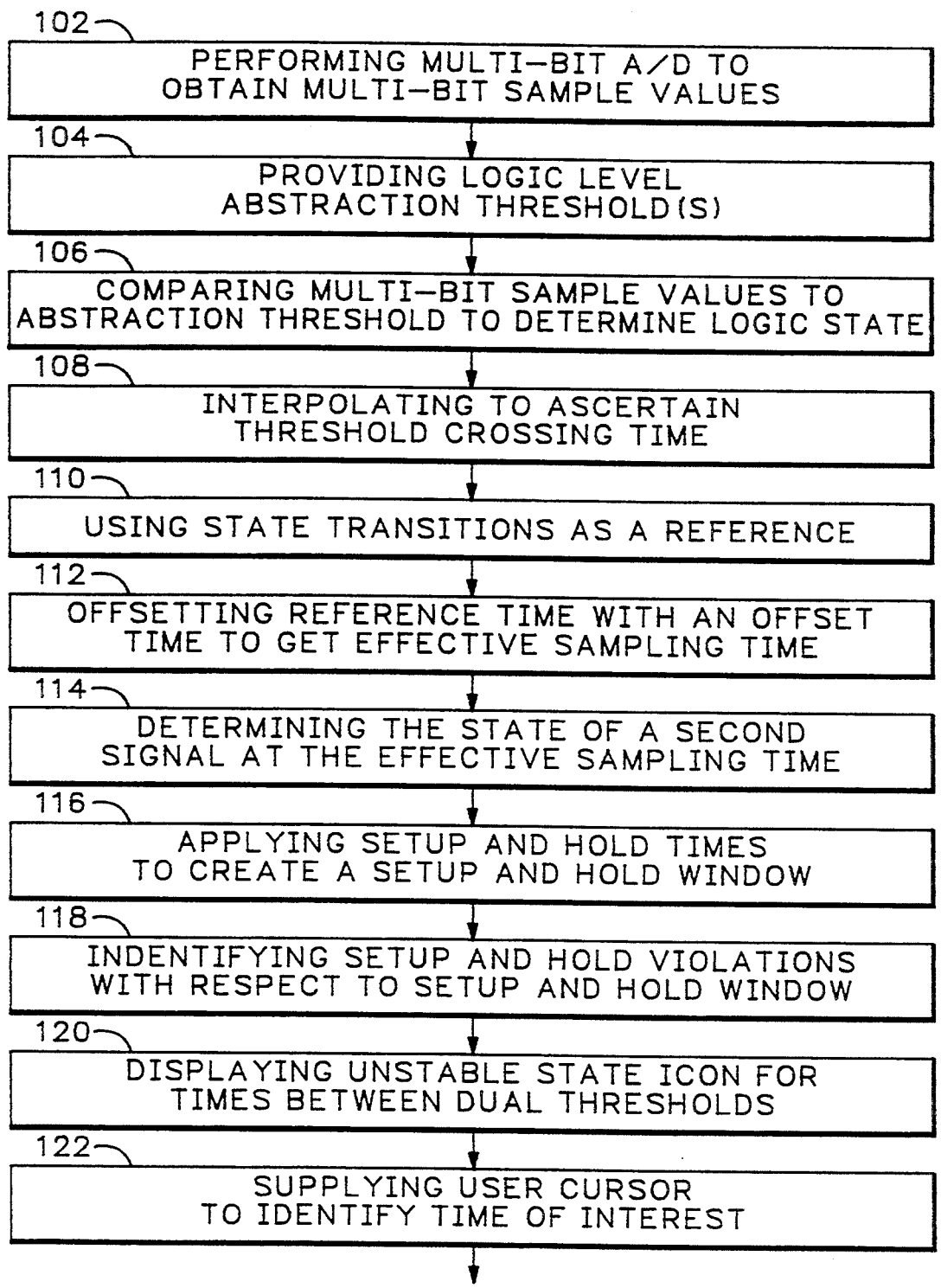
FIG. 4 is a process listing diagram illustrating the process steps involved in various embodiments of the invention.
Figure 4B:
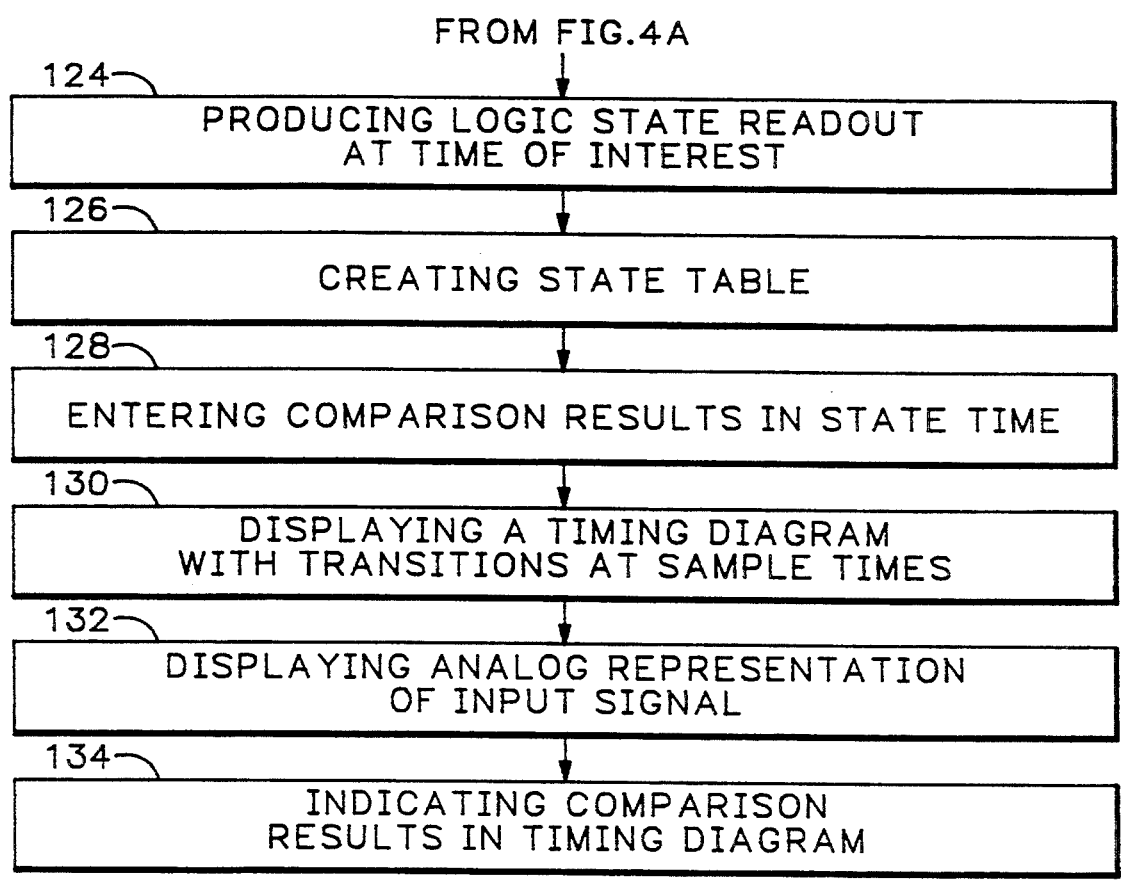

Throughout the following discussion reference will be made to the process steps illustrated in FIG. 4.

Using the method of the present invention, the time resolution of logic state transitions can be considerably improved. When the input signal is sampled 102 with higher voltage resolution in the initial data acquisition, so that multi-bit amplitude information is obtained instead of single-bit "one or zero" information, then a logic timing diagram can be constructed that has greater time resolution. This technique relies on being able to capture analog information, i.e., multi-bit digital sample values indicative of analog voltage values, at high speed and perform analog-to-digital conversion on the samples so obtained. Such techniques are well known in the oscilloscope arts and are described above in the Background of the Invention.

In part (E) of FIG. 1, the small squares indicate the voltage-versus-time values defined by the multi-bit digital sample values and their sequential addresses which correspond to the sampling times shown above in part (C). A logic abstraction threshold $AV_{TH}$ is also shown superimposed with these small squares. The logic abstraction threshold 104 is a "virtual threshold" that interpolated values are compared 106 with to determine the time at which a logic signal makes a transition into or out of a logic state. Note that the multi-bit sample value corresponding to time 3 is clearly low with respect to $AV_{TH}$, while the value corresponding to time 4 is slightly above it. By knowing the values associated with time 3 and time 4 and the times themselves, one can perform an interpolation 108, e.g., a straight line interpolation, to determine when the abstraction threshold would have been crossed if the actual voltage of the input signal was indeed changing linearly with time between these two sample times.

A linear interpolation between two sample times, $t_1$ and $t_2$, when the two voltage values obtained at those times, $V_1$ and $V_2$, are known to find the time $t_x$ that a threshold voltage $V_x$ is crossed is relatively straightforward:

$$t_x = t_2 - (t_2 - t_1)(V_2 - V_x)/(V_2 - V_1)$$

As shown in part (F) of FIG. 1, a logic timing diagram can be constructed and displayed using the more exact, interpolated signal transition times produced by the present invention. Since the crossing of the abstraction threshold that occurred between times 3 and 4 occurred quite close to time 4 and the conventional logic display 130 would have shown this transition as occurring at time 4, the difference between the two displays representation of this transition is quite small. However, when the transitions shown by each display are examined for the transition that occurs between times 13 and 14, the difference is much more significant. Since the interpolated transition point is only slightly after time 13 and the conventional display would have shown this transition all the way out at time 14, the representation of these transitions shown in the two displays is almost a complete inter-sample interval apart.

Figure 2:
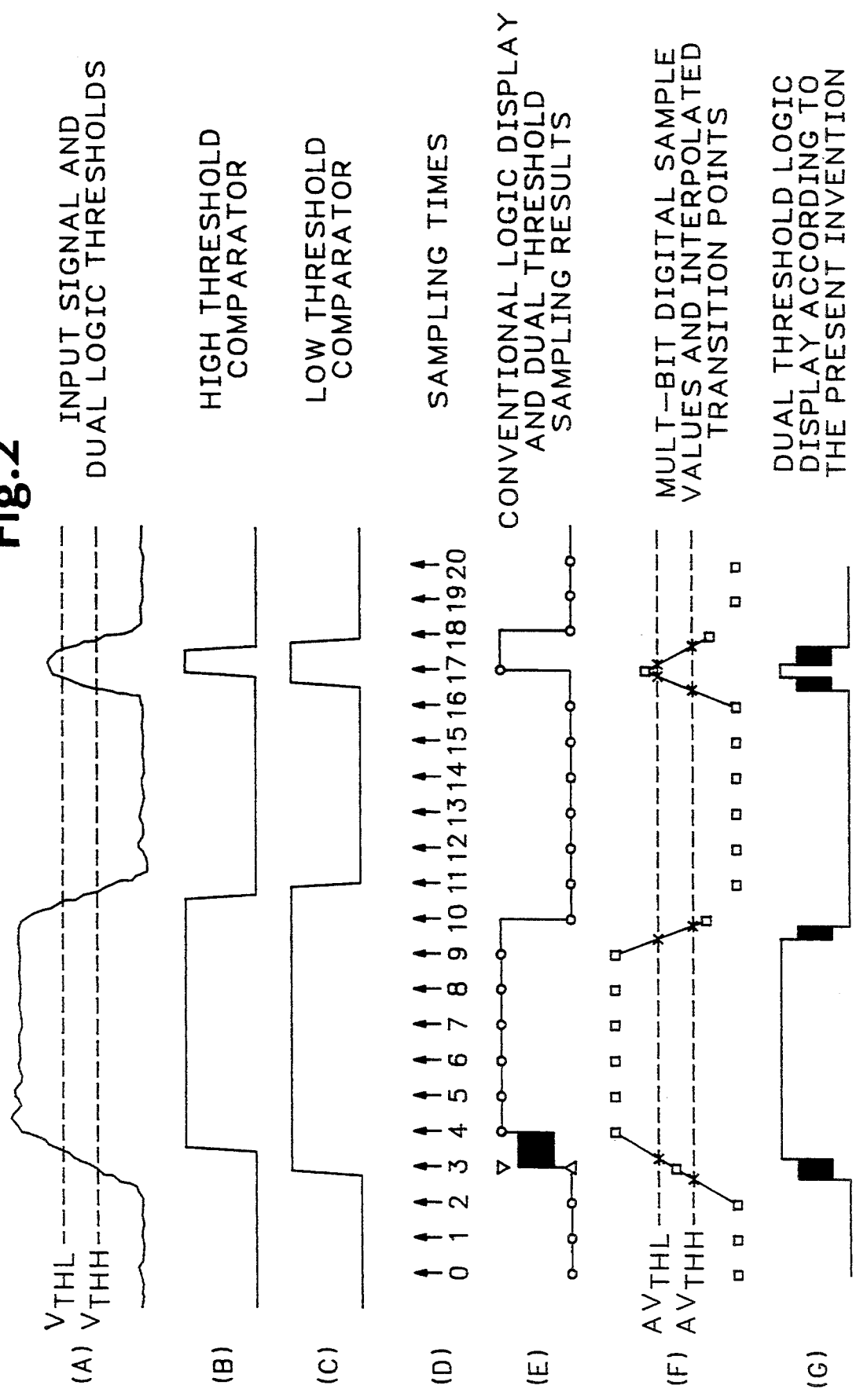
FIG. 2 is a set of diagrams similar to those shown in FIG. 1, but illustrating how the invention works in the context of an analysis based on dual thresholds.

Refer now to FIG. 2 which illustrates how the invention operates in a dual threshold context. Part (A) shows an input signal and two thresholds, $V_{THL}$ and $V_{THH}$. When the signal is below $V_{THL}$, the low threshold, it is definitely low. When it is above $V_{THH}$, the high threshold, it is definitely high. However, when the signal is in between these two thresholds, it is considered to be in transition and unstable, and capable of generating uncertainties and indeterminant outcomes in the digital components that receive this signal.

Part (B) of FIG. 2 shows the output of a comparator comparing the input signal to the high threshold, while part (C) shows the output of a comparator comparing the input signal to the low threshold. Both of these comparators desirably have very high gains and produce outputs with rapid rise and fall times. As in part (C) of FIG. 1, part (D) of FIG. 2 shows a series of up-pointing arrows indicating the times that sampling occurs, either conventional binary sampling, or multi-bit digital sampling of analog values, as is required for the practice of the present invention. Again, the arrows represent the active edges of acquisition clock signals or the active edges of a series of acquisition strobe signals.

Part (E) of FIG. 2 shows a conventional logic display for dual threshold data. In this display, the dark areas that do not extend to either logic level are iconic representations of the time intervals in which the signal is between logic thresholds. Various representations, or icons, have already been used in the logic analyzer world for indicating "unstable" time intervals. The dark dots in part (E) of FIG. 2 represent sample points at which both comparators were producing the same output, i.e., both high or both low. The little triangles indicate when the two comparator outputs were in different states, i.e., when the low comparator's output is high and high comparator's output is low. This condition indicates that the signal was unstable, and is the basis for determining that the unstable signal icon should be displayed in connection with this data.

Note in FIG. 2 that at sampling time 3 the signal was caught in the middle of a transition, and so an unstable icon is presented and this icon fills the whole inter-sampling period. However, when the input signal falls, between sampling times 9 and 10, the downward transition passes all of the way through the unstable state between the dual thresholds before the sampling at time 10 occurs, and therefore the conventional logic display shows an instantaneous transition between the two defined logic states and there is no visual indication of the unstable period that occurred during the actual signal's logic state transition.

Note further that the sample occurring at sampling time 17 happens to catch the marginal pulse on the input signal when it is above both the high threshold $V_{THH}$ and the low threshold $V_{THL}$, and so the conventional logic display of part (E) shows a clean, high-going pulse have a duration of one inter-sample interval and no unstable icon.

Part (G) of FIG. 2 shows the logic timing display according to the present invention. Again, the dark areas 120 that do not extend to either logic level represent time intervals in which the signal is between logic abstraction thresholds, but this display is different from that appearing in part (E). Now, instead of being a coarse and somewhat arbitrary representation, as in the conventional display, the display has a higher resolution and is less arbitrary in its representation of the underlying waveform. Now unstable intervals are shown by variable width icons 120 on both the rising and falling edges of both positive-going pulses, and these intervals are shorter and more realistic with respect to the underlying data than is the full inter-sample interval icon shown in part (E).

The improved display shown in part (G) of FIG. 2 is the result of the application of the method of the present invention. Part (F) of FIG. 2 shows how straight line interpolation 108 between the time and amplitude values defined by times associated with the sampling process and the information contained in the multi-bit digital samples. Note in part (F) that the multi-bit digital sample value that was taken at sample time 3 is approximately midway between the two abstraction thresholds, $AV_{THL}$ and $AV_{THH}$. When an interpolation is performed between the values for sample time 2 and sample time 3, and between the values for sample time 3 and sample time 4, relatively exact abstraction threshold crossing times can be determined 110. The use of these more accurate threshold crossing to form a logic timing diagram times makes the more accurate and meaningful display of part (G) possible.

While linear interpolation is the simplest form of interpolation available, other types, such as sin(x)/x, also known as sinc(x), might also be employed. When linear interpolation is used, there is no need to perform interpolation between pairs of points that are not associated with a logic abstraction threshold crossing. In this case, a preliminary step of testing each pair of data points to see if they are associated with a logic abstraction threshold crossing, i.e., whether the members of the pair are on opposite sides of the logic abstraction threshold value, can be employed. For example, for the data shown in FIG. 2, such testing would reveal that data point pairs 2–3, 3–4, 9–10, 16–17, and 17–18 have members that on opposite sides of at least one of the abstraction thresholds, while the rest of the data pairs all have both members on the same side of both abstraction thresholds.

A plurality of input signals can be displayed in one logic timing diagram based on representations extracted according to the present method. Those logic signals can be displayed individually or compressed into a busform. Busform displays can be generated in at least two ways, symbolically, as shown in U.S. Pat. No. 4,949,361 (previously incorporated by reference), or by overlaying a number of actual timing diagrams, as is illustrated in U.S. Pat. No. 4,979,177 (also previously incorporated by reference).

Figure 3:
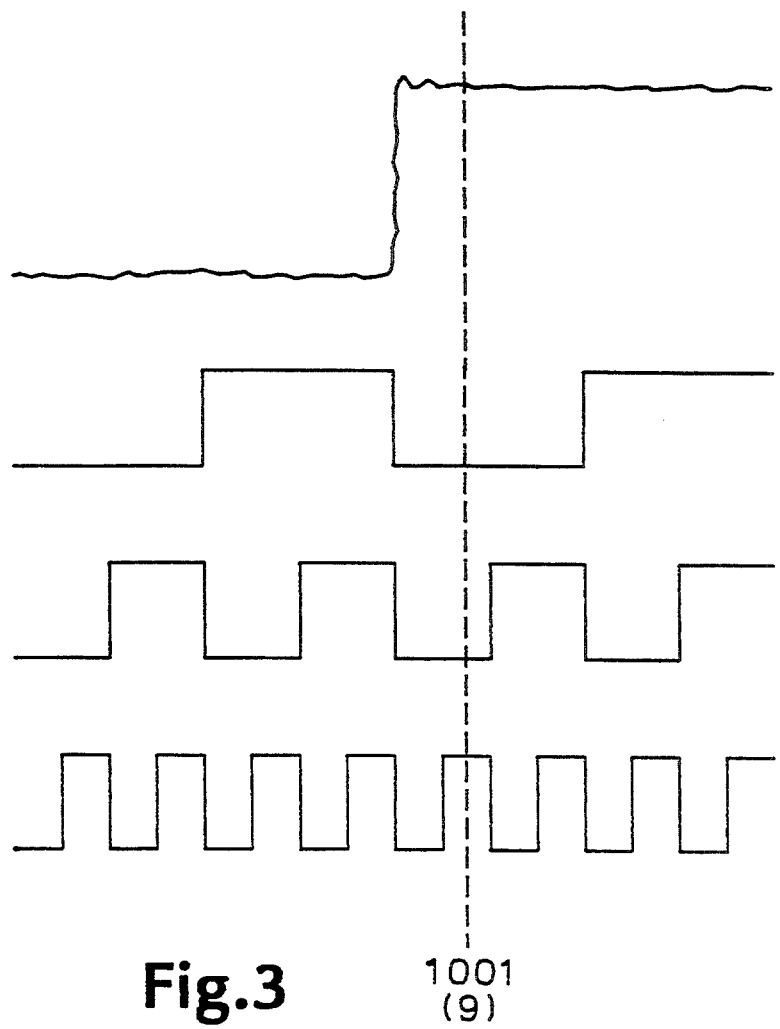
FIG. 3 is an illustration of a cursor readout of the digital value across a group of logic signals, one of which is displayed in analog form.

When multiple signals are present, even if they are not all being displayed, it can be very convenient to the user to provide a readout 124 of all of their values at a particular point in time identified by a cursor 122. Such a readout can be in any desired radix that is meaningful for the signals involved. For example, four signals can be represented as four binary bits, one hexadecimal character, or a digit of binary coded decimal. This readout can include information from more signals than are actually displayed on the screen in the timing diagram. Moreover, in accordance with the present invention, the cursor readout can include the values of signals that are displayed in analog form as well as those shown in logic timing diagram form. FIG. 3 shows a timing diagram containing four signals arranged with the most significant bit shown in analog form 132 at the top and the less significant three bits shown in logic timing diagram form at the bottom. A vertical cursor is also shown, with a readout positioned below it having both a binary and a hexadecimal readout (with the hexadecimal readout shown in parentheses). Even though a signal is displayed in analog form, the method of the present invention can be applied to the same data that underlies the analog display to ascertain the logic state of that same signal as if it were being displayed as a logic timing diagram.

In fact, even if none of the signals from which logic signal information is extracted are shown in a timing diagram, the state of the signals can still be shown at any desired time. This can be accomplished by performing interpolations between the closest data sampling points before and after the time in question to ascertain the state of each signal at that time. The interpolated data present at that time can then be displayed as either part of a state table 126 or timing diagram 134. A state table having both binary (BIN) and hexadecimal (HEX) listings is illustrated in U.S. Pat. No. 4,425,643 (previously incorporated by reference).

The times at which data is determined by interpolation can be controlled "pseudo-synchronously". If one signal, acquired asynchronously, is treated as a pseudo-synchronous clock signal, then the state of all of the other signals can be determined at the times when there is an active transition of this signal (where "active" means the edge that the logic devices change state in response to). To accomplish this, the pseudo-synchronous clock signal is processed first to determine the times at which that signal crossed a logic abstraction threshold going in the particular direction that corresponds to an active edge. Once abstraction threshold transition times for the active edges have been determined 110, the interpolated state of all of the other signals at that time can also be determined 114. The resulting data can then be displayed as desired, in either state 128 or timing diagram 134 form.

The pseudo-synchronous clock signal can also be delayed to produce a phase shift, or decimated to produce some fraction as many clock edges, or multiplied to produce a multi-phase clock signal, or even subjected to a combination of these operations. The pseudo-synchronous clock signal can be effectively delayed to produce a phase shift by examining the state of the other (data) signals at the time of active edge transitions of the pseudo-synchronous clock signal plus a constant time offset. By summing the pseudo-synchronous clock signal with positive, negative, or zero offset times, the resulting effective sampling time 112 can be moved backward or forward in time, or left where it is.

The pseudo-synchronous clock signal can be effectively decimated by using only every Nth active edge as a time to examine the interpolated states of the other signals. And, if the period of a pseudo-synchronous clock signal is known, it can be multiplied to produce a multi-phase clock signal by examining the interpolated values of the other data signals at N times evenly spaced over the period of the pseudo-synchronous clock signal for each actual occurrence of an active edge transition (as determined by the interpolation process first performed on the pseudo-synchronous clock signal).

Other operations can also be performed with reference to a pseudo-synchronous clock signal. A state table 126 display based on data 128 determined by interpolation over times 110 established by a pseudo-synchronous clock edge can be modified to show setup and hold violations 118. If a particular data signal is found to be making a transition or to be in the unstable state defined by dual abstraction thresholds during a setup and hold window 116 referenced to the active edge of the pseudo-synchronous clock signal, then some symbol, such as X or ? or V (for "violation"), can be used to show that the signal was not a constant 1 or a constant 0 during that interval, but rather that its behavior constituted a setup and hold violation 118.

The setup and hold violation check can be implemented by pre-processing all data channels to locate edge transitions, and then simply starting at the time of the active edge transition of the pseudo-synchronous clock signal and searching the records for each of the data channels involved in both directions (forward and backward in time) to determine if there are any transitions within the setup time before the active edge or the hold time after the active edge.

Copending U.S. patent application Ser. No. 07/947,205 by Stuebing et al. for "Setup or Hold Violation Triggering", hereby incorporated by reference, discloses circuitry for monitoring the timing relationship between an input data signal and an input clock signal and generating an output signal when a programmable setup or hold time requirement is violated. This hardware-based, realtime approach is quite different from the method of the present invention for finding setup and hold violations which relies on software post-processing of acquired data.

A actual setup and hold time measurement can be performed directly, instead of looking for violations. All of the signal lines can be examined to determine which one was the last one to change before a pseudo-synchronous active clock edge. The time between that last transition and the occurrence of the active edge of the pseudo-synchronous clock can then be presented to the user as a measured setup time. Similarly, all of the signal lines can be examined to determine which one was the first one to change after a pseudo-synchronous active clock edge. The time between that first transition and the occurrence of the active edge of the pseudo-synchronous clock can then be presented to the user as a measured hold time. When dual abstraction thresholds are employed, a transition can be defined as leaving the present logic state and entering the unstable state between logic states.

A skew measurement with enhanced resolution can also performed using the information about the state of logic signals that can be extracted from multi-bit digital sample values according to the method of the present invention. The time between when the first signal in a group makes a transition and the last signal in that same group makes a transition is the skew across that group of signals (provided that all of the input signal lines in the group of signals have been stimulated with the same input signal or signals having equivalent timing). The skew measurement derived in this way benefits from the enhanced resolution with which the transition times were determined by the method of the present invention.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A method for determining a time of occurrence of a logic signal state transition comprising the steps of:
    performing multi-bit A/D conversion on an input signal at a plurality of sample times to obtain a series of multi-bit digital sample values with each sample value being associated with a corresponding sample time;
    providing a logic level abstraction threshold as a reference for determining when a sample value is in a first logic state or a second logic state; and
    ascertaining from the series of multi-bit digital sample values and the logic level abstraction threshold a threshold crossing time, the threshold crossing time being the time at which an interpolated value of the input signal amplitude crossed the logic level abstraction threshold and indicating the time of occurrence of a logic signal state transition of the input signal.

2. A method according to claim 1 wherein the step of providing comprises the provision of two logic level abstraction thresholds, with a first logic level abstraction threshold defining a boundary between the first logic state and an unstable state intermediate to the first and second logic states, and a second logic level abstraction threshold defining a boundary between the second logic state and the unstable state.

3. A method according to claim 1 further comprising the step of:
    using the time of occurrence of the logic signal state transition as a reference time;
    summing the reference time with an offset time to produce an effective sampling time, said offset time potentially including positive, negative, and zero times; and
    determining the state of a second signal at the effective sampling time.

4. A method according to claim 3 further comprising the step of:
    displaying an entry in a state table indicating the state of the second signal at the effective sampling time.

5. A method according to claim 3 wherein the determining step comprises the steps of:
    applying setup and hold times to the effective sampling time to create a setup and hold window; and
    identifying the state of the second signal as a violation if the second signal does not remain in a constant state throughout the setup and hold window.

6. A method according to claim 5 further comprising the step of:
    displaying an entry in a state table indicating the state of the second signal at the effective sampling time.

7. A method according to claim 1 further comprising the step of:
    using the time of occurrence of the logic signal state transition as a reference time;
    summing the reference time with an offset time to produce an effective sampling time, said offset time potentially including positive, negative, and zero times; and
    determining the state of a second signal at the effective sampling time.

8. A method according to claim 7 further comprising the step of:
    displaying an entry in a state table indicating the state of the second signal at the effective sampling time.

9. A method according to claim 7 further comprising the step of:
    displaying logic diagram binary waveform representations including a logic level transition based on the logic signal state transition time.

10. A method according to claim 7 wherein the determining step comprises the steps of:
    applying setup and hold times to the effective sampling time to create a setup and hold window; and identifying the state of the second signal as a violation if the second signal does not remain in a constant state throughout the setup and hold window.

11. A method according to claim 10 further comprising the step of:

displaying an entry in a state table indicating the state of the second signal at the effective sampling time.

12. A method according to claim 10 further comprising the step of displaying logic diagram binary waveform representations including a logic level transition based on the logic signal state transition time.

13. A method according to claim 12 further comprising the steps of:

supplying a user with a cursor to enable the user to identify a sample time of interest; and producing a readout of the logic state of the input signal at the identified sample time of interest according to the results of the comparison.

14. A method according to claim 12 wherein the logic level transition is displayed as an icon indicative of the unstable state intermediate to the first and second logic states.

15. A method according to claim 14 wherein the icon has a width that is defined by logic signal state transition times into and out of the unstable state.

16. A method according to claim 10 further comprising the step of:

using the time of occurrence of the logic signal state transition as a reference time;

summing the reference time with an offset time to produce an effective sampling time, said offset time potentially including positive, negative, and zero times; and determining the state of a second signal at the effective sampling time.

17. A method according to claim 16 further comprising the step of:

displaying an entry in a state table indicating the state of the second signal at the effective sampling time.

18. A method according to claim 16 wherein the determining step comprises the steps of:

applying setup and hold times to the effective sampling time to create a setup and hold window; and identifying the state of the second signal as a violation if the second signal does not remain in a constant state throughout the setup and hold window.

19. A method according to claim 18 further comprising the step of:

displaying an entry in a state table indicating the state of the second signal at the effective sampling time.

20. A method according to claim 18 further comprising the steps of:

supplying a user with a cursor to enable the user to identify a sample time of interest; and producing a readout of the logic state of the input signal at the identified sample time of interest according to the results of the comparison.

21. A method for communicating both analog and digital information to an instrument user comprises the steps of:

displaying an analog waveform representation of an input signal;

supplying the user with a cursor positionable along the time axis of the analog waveform display, the cursor having a current position;

performing multi-bit A/D conversion on an input signal at a plurality of sample times to obtain a series of multi-bit digital sample values with each sample value being associated with a corresponding sample time;

providing a logic level abstraction threshold as a reference for determining when a sample value is in a first logic state or a second logic state; and ascertaining from the series of multi-bit digital sample values and the logic level abstraction threshold a threshold crossing time, the threshold crossing time being the time at which an interpolated value of the input signal amplitude crossed the logic level abstraction threshold and indicating the time of occurrence of a logic signal state transition of the input signal.

* * * * *